United States Patent [19]

Ang et al.

[11] Patent Number: 4,707,721

[45] Date of Patent: Nov. 17, 1987

[54] PASSIVATED DUAL DIELECTRIC GATE SYSTEM AND METHOD FOR FABRICATING SAME

[75] Inventors: Saw T. Ang, Garland; Patrick A. Curran, Plano, both of Tex.

[73] Assignee: Texas Instruments Incorporated, Dallas, Tex.

[21] Appl. No.: 831,379

[22] Filed: Feb. 20, 1986

[51] Int. Cl.$^4$ .................... H01L 29/78; H01L 29/04; H01L 29/14; H01L 29/46

[52] U.S. Cl. .................................. 357/54; 357/23.4; 357/23.15; 357/59; 357/60

[58] Field of Search .................. 357/23.4, 23.15, 2, 357/59 R, 59 G, 54, 60

[56] References Cited

U.S. PATENT DOCUMENTS 3,996,656  12/1976  Cook, Jr. ................... 357/23.15
4,570,328   2/1986  Price et al. ................ 357/23.15

FOREIGN PATENT DOCUMENTS 57-7972  1/1982  Japan ........................... 357/23.15

OTHER PUBLICATIONS

Arthur J. Learn, "Modeling of the Reaction for Low Pressure Chemical Vapor Deposition of Silicon Dioxide", *Journal of the Electrochemical Society*, vol. 132, No. 2, pp. 390-393, Feb. 1985.
J. Nulman, et al., "Rapid Thermal Processing of Thin Gate Dielectrics, Oxidation of Silicon", *IEEE Elec. Dev. Ltrs.*, vol. EDL6, No. 5, May 1985.
C. Y. Ting, "Using Titanium Nitride and Silicon Nitride for VLSI Contacts", *IBM Technical Disclosure Bulletin*, vol. 24, No. 4, Sep., 1981 pp. 1976-1977.
H. J. Herzog, et al., "X-Ray Investigation of Boron- and Germanium Doped Silicon Epitaxial Layers", *J. Electrochem. Soc., Solid State Science-and Technology*, Dec. 1984, pp. 2969-2974.
F. E. Holmes, et al., "VMOS-A New MOS Integrated Circuit Technology", *Solid State Electronics*, vol. 17, pp. 791-797, 1974.
Taher Daud, "Submicron Silicon MOSFET", *NASA Tech. Briefs*, p. 40, Jan./Feb., 1986.

*Primary Examiner*—Andrew J. James
*Assistant Examiner*—John Lamont
*Attorney, Agent, or Firm*—Gary C. Honeycutt; N. Rhy Merrett; Melvin Sharp

[57] ABSTRACT

A passivated dual dielectric gate system compatible with low temperature processing utilizes a dual dielectric system with a silicon dioxide dielectric film or layer at the monocrystalline substrate surface, or termination. The dual dielectric system includes a dielectric film at the substrate surface of thicknesses of from 200 to 1000 Å(or greater ). Respective layers of undoped amorphous silicon and titanium nitride overlie the top of the silicon dioxide and an aluminum gate metal layer overlies the titanium nitride layer. The structure can be patterned by selectively patterning photoresist and a dry or dry/wet etch processses. The structure is patterned and etched as desired. The system has enhanced surface mobilities due to lower oxide fixed charge density and smoother, more abrupt dielectric/monocrystalline interface region, is applicable to wide variety of MOSFET applications, and is inherently less electrostatic discharge (ESD) sensitive than conventional gate structures due to the distributed electric field.

5 Claims, 1 Drawing Figure

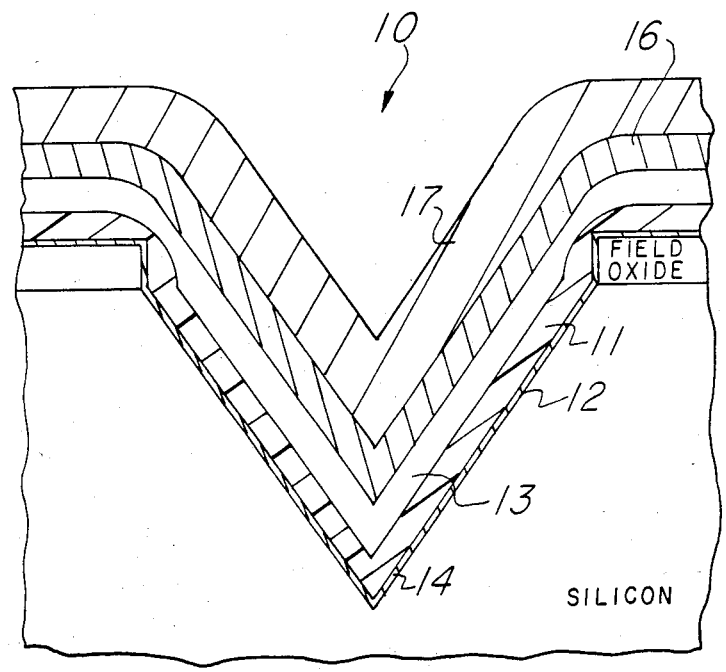

PASSIVATED DUAL DIELECTRIC GATE SYSTEM AND METHOD FOR FABRICATING SAME

BACKGROUND OF THE INVENTION

1. Field of the Invention

This invention relates to improvements in MOSFET devices, and more particularly to a passivated dual dielectric gate system in MOSFET devices, and to methods for making such devices.

2. Description of Related Art Including Information Disclosed under §§1.97-1.99

A significant yield loss in MOSFET device fabrication is due to particulates during silicon dioxide growth or subsequent metal processing. Thicker dielectrics to reduce these effects tend to accordingly reduce the device transconductance. Moreover, conventional metal or polysilicon gate structures are unforgiving with respect to field stresses, and hence, are ESD sensitive. Conventional silicon dioxide gate systems are sensitive to moisture due to trapping effects.

Gate oxide defects account for one of the largest yield loss mechanisms in MOSFET devices. This failure mechanism is more acute in power VMOS devices where the channel region resides on a plane 54.7° oblique to the planar <100> surface. A thick silicon dioxide gate is imperative to reduce the yield loss due to pin-holes or other defects associated with thin oxides. Unfortunately, this thick gate oxide reduces the device transconductance, a critical device parameter which is proportional to the specific capacitance of the gate oxide. The present polysilicon gate technology employs a thick (typically 5000 Å) layer of phosphorous doped polysilicon overlaying the thermal silicon dioxide. This heavily doped polysilicon layer serves as the gate electrode of the MOSFET. Although this thick phosphorous doped polysilicon gate helps to protect the underlying gate oxide during subsequent chemical processing, it does not alleviate the problem of gate-to-substrate shorts through the pin-holes or micropores in the thin silicon dioxide. Moreover, the contacting aluminum to the heavily phosphorous doped polysilicon tends to suffer from a galvanic corrosion in the presence of moisture, and thereby, creating a serious reliability failure mechanism.

A dual dielectric gate structure of aluminum/silicon nitride/silicon dioxide has been employed. Although silicon nitride is impervious to alkali ion migration, it suffers from deleterious memory effect and has only a slight permitivity advantage over silicon dioxide with a dielectric constant between 5.8 and 6.1. Deposited silicon nitride films have a large amount of built-in tensile stress (approximately $5 \times 10^9$ dyne/cm$^2$) when grown at 700° C., as a result, peeling and cracking is a common problem in silicon nitride films.

SUMMARY OF THE INVENTION

This invention proposes a passivated dual dielectric gate system which is compatible with low temperature processing, and which has enhanced, surface mobilities due to lower fixed charge density and a smoother, more abrupt dielectric/monocrystalline interface region which overcomes the deficiencies described above with respect to the prior art. This gate system is applicable to wide variety of MOSFET applications and is inherently less electrostatic discharge (ESD) sensitive than conventional gate structures due to the distributed electric field.

This invention utilizes a dual dielectric system with a densified low pressure chemical vapor deposited (LPCVD) silicon dioxide comprising the dielectric film at the monocrystalline termination. An undoped layer of amorphous silicon comprises the second dielectric film on top of the densified LPCVD silicon dioxide and the gate electrode is of titanium nitride/aluminum or titanium nitride.

Thus, the dual dielectric concept improves gate performance by protecting and enhancing the dielectric nearest the monocrystalline region by serving to protect the underlying silicon dioxide, to distribute fields in the dual dielectric, to current limit defects to the underlying silicon dioxide, to reduce the fixed charge density and mobile ion density of the silicon dioxide, to densensitize silicon dioxide with respect to metal processing, and to immunize the gate structure from external ions and moisture. The deposited nature of the gate structure enhances applications in thin abrupt junction devices, due to lower thermal processing budget, and in non-planar topology applications due to the contoured nature. This invention further enhances the ESD capability of gate structures. Finally, this invention is compatible with present high volume, low cost manufacturing techniques.

BRIEF DESCRIPTION OF THE DRAWING

The invention is illustrated in the accompanying drawing, in which:

FIG. 1 is a side cross-sectional view of a dual dielectric gate structure in accordance with the invention constructed over a non-planar VMOS gate region in accordance with the method of the invention.

DETAILED DESCRIPTION OF THE PREFERRED EMBODIMENTS

With reference now to FIG. 1, and in accordance with the invention, a dual dielectric system 10 is shown in use with a VMOS device. VMOS devices are known in the art, for example, as shown by Holmes et al, "VMOS—A New MOS Integrated Circuit Technology," Solid State Electronics, Vol. 17, p. 791 (1974), said article being incorporated herein by reference as background. It will be appreciated that although the invention is illustrated in the context of a VMOS device, it is applicable to wide variety of MOSFET applications.

Thus, the dual dielectric system 10 has a silicon dioxide dielectric film 11 at the surface or termination 12 of a monocrystalline substrate. Although the silicon dioxide film 11 can be formed by a conventional thermal oxidation, as known in the art, preferably, it is formed of by a densified low pressure chemical vapor deposited (LPCVD) silicon dioxide process. Thus, subsequent to wafer cleaning by normal chemical treatments, the substrate 5 is inserted into an LPCVD reactor (not shown) and and the reactor is pumped down to a low pressure. Although any LPCVD reactor could be utilized, it has been found that superior quality films result by utilization of a dome reactor, such reactors being known in the art, for example, as shown by Learn, "Modeling of the Reaction for Low Pressure Chemical Vapor Deposition of Silicon Dioxide", *Journal of the Electrochemical Society*, Vol. 132, No. 2, February, 1985, pp. 390–393. A pyrolysis of monosilane (250 cc/min) in the presence of oxygen (250 cc/min) is performed at 420° C. with a pressure of 100 mT. Typical oxide thicknesses can vary from 200 to 1000 Å (or greater) with a typical deposition rate of 200 Å per minute. Deposited oxide is especially advantageous over a thermal oxide on non-planar device topologies because deposited oxide results in complete step coverage. After oxide deposition, the partial oxides are densified to form the silicon dioxide layer 11 by employing a dual ambient rapid thermal anneal utilizing halogen lamps. The wafers 5 are first annealed at typically at a temperature between about 1000° C. and 1200° C., for example, 1100° C., for 60 seconds in dry oxygen followed by an inert anneal, e.g. argon, at a temperature also at between about 1000° C. and 1200° C., for example, 1100° C., for 60 seconds.

It has been found that excellent interfacial properties and lower oxide fixed charge densities can be produced from the growth of an interfacial thermal oxide during the rapid thermal annealing in oxygen by the diffusion of oxidant through the deposited LPCVD silicon dioxide.

On the other hand, optionally, a layer of oxide 14 can be grown first in some instances, as shown, if desired, before the LPCVD silicon dioxide layer 11 is deposited in order to passivate the chemically cleaned monocrystalline silicon surface. Rapid thermal oxide growth can be accomplished by techniques known in the art, as shown, for example, by Nulman, et al., "Rapid Thermal Processing of Thin Gate Dielectrics. Oxidation of Silicon", IEEE Electron Device Letters, Vol. EDL-6, No. 5, May, 1985, pp. 205-207. Thus, The oxide layer 14 can be formed in a rapid thermal processor at a typical temperature of about 1150° C. in dry oxygen ambient for ½ to 1 minute to yield an oxide thickness of approximately 140 Å to 280 Å.

An undoped layer of amorphous silicon 13 is then deposited on top of the silicon dioxide in an LPCVD reactor by the pyrolysis of monosilane ($SiH_4$) in the temperature range of 540° C. to 580° C. The thickness of this undoped amorphous silicon is typically 500-1000 Å. To control the deposition rate of the amorphous silicon, the monosilane is diluted with an inert gas, usually argon, with the monosilane being typically 5% by volume. Low system pressure in the LPCVD reactor is also essential to achieve good uniformity across the wafer; a typical flow rate of the argon carrier gas is 50 cc/min. In cases where a lower deposition temperature is desired, disilane ($Si_2H_6$) can be substituted for which a typical deposition temperature is around 450° C. to 500° C. There are many advantages of this metal-amorphous silicon-oxide-monocrystalline silicon (MSOS) over a more conventional metal-nitride-oxide-silicon (MNOS) gate. The amorphous silicon has a higher dielectric constant of 11.7 compared to the dielectric constant of silicon nitride about 6. Hence, a thicker layer of amorphous silicon can be used without the deleterious effect of lowering the effective gate capacitance per unit area. Amorphous silicon can be deposited at a much lower temperature (450°-580° C.) than silicon nitride. Due to the lower stress of the amorphous silicon compared to silicon nitride, less stress is exerted to the underlying silicon dioxide, which helps preserve the integrity of the underlying silicon dioxide. Due to the charge compensation effects of the undoped amorphous silicon on the underlying silicon dioxide, the effective oxide fixed charge density of this dielectric system is lower than the conventional silicon dioxide gate.

Aluminum-amorphous silicon interphase reaction begins at temperatures of nearly half the eutectic melting point of 577° C. This interphase reaction would occur during the hydrogen annealing of microalloy temperature of 450° C. To circumvent this aluminum-silicon interphase problem, a thin (500-1000 Å) layer 16 of titanium nitride is sputtered over the amorphous silicon layer 13. The use of titanium nitride as a contact is known (although not as a gate electrode), as shown by Ting, "USING TITANIUM NITRIDE AND SILICON NITRIDE FOR VLSI CONTACTS", IBM Technical Disclosure Bulletin, Vol. 24, No. 4, September, 1981, pp. 1976-1977. The titanium nitride, therefore, is done by sputtering titanium in a nitrogen/argon plasma at low pressures, typically between about 10 to 15 mT with a power of 4.5 kVA. The titanium nitride layer 16 serves as a conductive glass which serves as a diffusion barrier to metals, ions, and moisture in order to passivate and to protect the dual dielectric gate 10. It is very important to prevent the gate metal from reacting with the amorphous silicon film, thus, a gate metal layer 17 is evaporated or sputtered over the titanium nitride layer 16. In the embodiment shown, an aluminum gate metal 17 is employed with a thickness of 5,000 Å. It should be noted that the gate structure of FIG. 1 also exhibits the advantages of a contoured, deposited gate in lieu of a thermal oxide over a non-planar region with a nitride type field oxide. In some instances, a thick layer of titanium nitride of thickness of about 5000 Å can be sputtered over the undoped amorphous silicon layer 13, thus eliminating the need for the aluminum gate metal layer 17.

The gate structure 10 can easily be patterned by selectively patterning photoresist and performing a totally dry or a dry/wet etch process. The aluminum layer 17 can be etched with a dry etch or a wet phosphoric acid solution. The titanium nitride layer 16 and the amorphous silicon layer 13 can be etched with a dry $CF_4$ plasma etch. Finally the densified silicon dioxide layer 11 can be dry etched or wet etched with buffered hydrofluoric acid.

Although the invention has been described and illustrated with a certain degree of particularity, it is understood that the present disclosure has been made by way of example only and that numerous changes in the combination and arrangement of parts or steps may be resorted to by those skilled in the art without departing from the spirit and the scope of the invention as hereinafter claimed.

We claim:

1. A passivated dual dielectric gate system comprising:
    a monocrystalline substrate having a surface;
    a passivated densified silicon dioxide dielectric film at the surface of the substrate, formed to a thickness of 200-1000 Å by low pressure chemical vapor deposition (LPCVD);
    an undoped layer 500 to 1000 Å thick of amorphous silicon on the silicon dioxide; and
    a layer 500-1000 Å thick of titanium nitride on the amorphous silicon to passivate and protect the dual dielectric gate.

2. The dual dielectric gate system of claim 1 further comprising a gate metal over the titanium nitride.

3. The dual dielectric gate system of claim 1 wherein said a gate metal comprises an aluminum gate metal of thickness of about 5,000 Å.

4. A passivated dual dielectric gate system comprising:
    a monocrystalline substrate;

a silicon dioxide dielectric film of thickness of between approximately 200 to 1000 Å at a surface of the substrate;

an undoped layer of amorphous silicon of thickness of between about 500 to 1,000 Å on the silicon dioxide;

a thin layer of titanium nitride of thickness of between about 500 to 1,000 Å on the amorphous silicon to passivate and to protect the dual dielectric gate;

and a gate metal on the titanium nitride.

5. The dual dielectric gate system of claim 4 wherein said silicon dioxide is a densified low pressure chemical vapor deposited (LPCVD) silicon dioxide, and said gate metal comprises an aluminum of thickness of about 5,000 Å.

* * * * *